United States Patent
Lagakos et al.

(10) Patent No.: US 10,107,839 B1
(45) Date of Patent: Oct. 23, 2018

(54) FIBER OPTIC SENSOR SYSTEM FOR DETECTION OF ELECTRIC CURRENTS AND OTHER PHENOMENA ASSOCIATED WITH GEOMAGNETIC DISTURBANCES

(71) Applicant: Fiber Optic Sensor Systems Technology Corporation, Washington, DC (US)

(72) Inventors: Nicholas Lagakos, Silver Spring, MD (US); Patrick Hernandez, Silver Spring, MD (US); David Wells, Fairfax, VA (US); Victor Kaybulkin, Chantilly, VA (US)

(73) Assignee: FIBER OPTIC SENSOR SYSTEMS TECHNOLOGY CORPORATION, Washington, DC (US)

( * ) Notice: Subject to any disclaimer, the term of this patent is extended or adjusted under 35 U.S.C. 154(b) by 0 days.

(21) Appl. No.: 14/303,215

(22) Filed: Jun. 12, 2014

(51) Int. Cl.
    *G01R 19/00* (2006.01)
    *G01R 33/032* (2006.01)

(52) U.S. Cl.
    CPC ..... *G01R 19/0092* (2013.01); *G01R 33/0327* (2013.01)

(58) Field of Classification Search
    CPC ... G02B 6/00; G01R 19/0092; G01R 33/0327
    See application file for complete search history.

(56) References Cited

U.S. PATENT DOCUMENTS

| 5,400,142 A | 3/1995 | Lavin |
| 5,631,559 A | 5/1997 | Oliver |
| 6,246,638 B1 * | 6/2001 | Zook ..... G01P 15/097 367/140 |
| 6,621,258 B2 | 9/2003 | Davidson |
| 7,020,354 B2 | 3/2006 | Lagakos |
| 7,149,374 B2 | 12/2006 | Lagakos |
| 7,327,512 B2 | 2/2008 | Watanabe |
| 7,379,630 B2 | 5/2008 | Lagakos |
| 7,460,740 B2 | 12/2008 | Lagakos |
| 7,646,946 B2 | 1/2010 | Lagakos |
| 7,697,798 B2 | 4/2010 | Lagakos |
| 7,714,735 B2 | 5/2010 | Rockwell |

(Continued)

FOREIGN PATENT DOCUMENTS

CN 102156213 A * 8/2011

*Primary Examiner* — Minh Phan
*Assistant Examiner* — Zannatul Ferdous
(74) *Attorney, Agent, or Firm* — Hogan Lovells US LLP

(57) ABSTRACT

A fiber optic sensor system for measuring electric currents, such as the associated with geomagnetic disturbances and electromagnetic pulses. A fiber optic sensor system is disclosed including at least one light source, one or more first optical fibers having a first end arranged to receive light from the light source(s) and transmit the light to at least one of the sensor, and one or more second optical fibers arranged to receive reflected light from the fiber optic sensors and transmit the reflected light to a light sensing element. Using the sensors and the system, it is possible to measure currents within a structure of interest, such as upon the grounded neutral of an electric power transformer, take multiple measurements of current at the same piece of equipment or at multiple locations, or measure current and other physical phenomena on separate materials or structures.

37 Claims, 7 Drawing Sheets

(56) References Cited

U.S. PATENT DOCUMENTS

| | | | |
|---|---|---|---|
| 7,786,719 B2 | 8/2010 | Kurosawa | |
| 8,195,013 B2 | 6/2012 | Lagakos | |
| 2004/0109499 A1* | 6/2004 | Cern | H04B 3/54 |
| | | | 375/222 |
| 2009/0315404 A1* | 12/2009 | Cramer | H02J 3/383 |
| | | | 307/82 |
| 2012/0019965 A1* | 1/2012 | Faxvog | H02H 3/52 |
| | | | 361/42 |
| 2013/0163915 A1* | 6/2013 | Lee | G02B 6/001 |
| | | | 385/12 |
| 2013/0166227 A1* | 6/2013 | Hermann | G01N 29/30 |
| | | | 702/51 |
| 2014/0180589 A1* | 6/2014 | Kim | G01C 21/005 |
| | | | 702/5 |
| 2014/0219620 A1* | 8/2014 | Jaaskelainen | G02B 6/4471 |
| | | | 385/135 |

\* cited by examiner

FIBER OPTIC SENSOR SYSTEM FOR DETECTION OF ELECTRIC CURRENTS AND OTHER PHENOMENA ASSOCIATED WITH GEOMAGNETIC DISTURBANCES

CROSS-REFERENCE TO RELATED APPLICATIONS

The theory of intensity modulated optical fiber sensors, and examples of such sensors, are disclosed in the U.S. Government-owned inventions by Nicholas Lagakos et al., described in U.S. Pat. No. 7,020,354: Intensity Modulated Fiber Optic Pressure Sensor; U.S. Pat. No. 7,379,630: Multiplexed Fiber Optic Sensor System; U.S. Pat. No. 7,646,946: Intensity Modulated Fiber Optic Strain Sensor; U.S. Pat. No. 8,195,013: Miniature Fiber Optic Temperature Sensors, and others (collectively, the "U.S. Government Patents"). U.S. Ser. No. 14/222,225, filed Mar. 21, 2014 (the "Electromagnetic Phenomena Sensor Patent Application") discloses intensity modulated fiber optic sensors that measure electromagnetic phenomena such as electrical and magnetic fields, voltage, and current. U.S. Ser. No. 14/283,074, filed May 20, 2014, discloses a system of one or more intensity modulated fiber optic sensors that measure electromagnetic phenomena such as electrical and magnetic fields, voltage, and current, and other physical phenomena (the "Electromagnetic Phenomena Sensor System Patent Application"). The disclosures of the U.S. Government Patents, the Electromagnetic Phenomena Sensor Patent Application, and the Electromagnetic Phenomena Sensor System Patent Application are incorporated herein by reference.

FIELD OF INVENTION

This invention relates to a system of intensity modulated fiber optic sensors for detecting the electric currents produced by geomagnetic disturbances or electromagnetic pulses, and other physical phenomena.

BACKGROUND

In recent years, fiber optic technology has formed the basis for different types of sensors, such as microphones, pressure sensors, strain sensors, and others. Optical fiber sensors can use interferometry or intensity modulation, of which intensity modulated fiber optic sensors are simpler and less expensive.

Intensity modulated fiber optic sensors have the advantages of being highly accurate, resistant to electromagnetic interference ("EMI"), capable of being multiplexed, capable of long-distance sensing applications, physically robust, and physically simple when compared to alternative measurement approaches for the physical effects of interest. Since fiber optics use light rather than electricity, a fiber optic sensor is generally insensitive to EMI and is therefore more efficient in an environment that has a large amount of electromagnetic energy. As a result, fiber optic sensors can be located adjacent to or attached to circuits that generate large electromagnetic fields or in areas with high potential for EMI, without negative effects to either the measurement or the measuring equipment.

Geomagnetically-induced currents ("GICs") are produced by solar storms, which emanate from the sun as coronal mass ejections ("CMEs"), can disturb the Earth's geomagnetic field over wide geographic regions. See, e.g., North American Electric Reliability Corporation, Geo-Magnetic Disturbances (GMD): Monitoring, Mitigation, and Next Steps (2011). The disturbance in the Earth's geomagnetic field caused by a CME (or in the case of an electromagnetic pulse, or "EMP", by a man-made mechanism) can create currents to flow in the ground which flow into any connected conducting structure, such as the grounded neutral of a power transformer. GICs are expressed as direct currents ("DC") or quasi-DC currents (with frequencies below 1 Hz), although the precise variation in frequency is dependent upon the time variation of the electric field. Because the cross-sectional area of the single-turn loop represented by the power line and a ground return is large, the current produced can be large (i.e. –100 amps or more). Once GICs or EMPs enter into the bulk power system's transmission and generation facilities, they flow along available conducting paths such as electric transmission lines, metallic pipelines, telecommunications cables, and railways.

When GICs or EMP currents enter power system equipment and facilities they may produce harmful short-term and long-term impacts to power systems, including major increases in system reactive requirements, potential for permanent equipment damage, and the disruption of interconnected system operation. In electric networks, GICs can saturate and may damage some equipment, which can be difficult and expensive to replace in a timely manner. Without adequate steps to mitigate their effects, these currents can disrupt the normal operation of the electric power system, damage equipment, and pose a substantial risk to system reliability. Studies of the potential impact of substantial GMD have found that a major event could leave 150 million Americans without power for an extended period, place more than 350 Bulk-Power System transformers at risk of permanent damage, and cause economic damages as high as $2 trillion. See Oak Ridge National Laboratory, *Geomagnetic Storms and Their Impacts on the U.S. Power Grid*, Meta-R-319 at 4-14. A severe geomagnetic storm in 1989 affected the Hydro-Quebec power grid resulting in a cascading failure of the system, leaving over six million people without power for several hours and causing significant economic loss. Other severe geomagnetic disturbances have also been documented, including the 1859 Carrington Event that is estimated to have been substantially greater than the 1989 Hydro-Quebec event. See Pacific Northwest National Laboratory, Geomagnetic Storms and Long-Term Impacts on Power Systems (2011).

Given the potential impact of a significant GIC or EMP event, there has been increasing emphasis upon the need for approaches that can accurately identify and measure GICs and EMPs in order that system operators may take steps to mitigate their potential effects upon the reliable operation of electrical networks. See, e.g., Federal Energy Regulatory Commission, Order No. 779, *Reliability Standards for Geomagnetic Disturbances* (2013).

Traditional approaches for measuring current in electric power systems cannot readily measure the low frequency (sub-1 Hz) electric phenomena associated with these events. This is related primarily to the fact that electric power system measuring and monitoring devices are intended to measure the alternating currents ("AC") typically associated with power system operation and requires the presence of an AC current to generate its measurement. Due to the need for an AC current to perform measurement, traditional current transformers ("CTs"), a prevalent current measuring device, cannot readily measure direct currents. A resistive shunt can be used, but these devices have a strong temperature dependency due to their construction as a resistor, have a relatively short useful life, and require regular recalibration in the field in order to maintain an accurate level of measurement which increases the long-term operating costs associated with these devices. Resistive shunts also increase in size, weight, and complexity as the rated current measurement increases. These devices require a direct electrical connection, which can create a safety risk both to the equipment itself and to personnel in the event of a fault. More recently, interferometry based optical measurement devices have been used, but these devices tend to be very expensive in addition to having significant temperature dependency issues. These devices also use lasers as a light source, have complicated associated light-measuring techniques, and require regular recalibration, all of which raise the complexity and cost associated with this technique.

Accurate information is critical regarding the presence of GIC or EMP-induced currents in the operation of electrical power generation, transmission, and distribution systems. What is needed is a system that can accurately measure DC and quasi-DC currents, is di-electric in nature, is robust enough for field use, and is relatively non-complex. Intensity modulated fiber optic sensors are capable of accurately measuring DC and quasi-DC currents (i.e. –very low frequency) associated with GMDs and EMPs. This information can be used to determine the presence and magnitude of potentially harmful currents being introduced into key elements of the electric grid through the grounded neutral of a power transformer or a system of power transformers and into other components of the electrical power system, such as transmission lines. Fiber optic sensors also have inherent advantages in terms of accuracy, EMI sensitivity, safety, size, and robustness compared with existing measurement devices and systems that make them a preferable approach to measure such currents.

The system disclosed presents an approach by which sensors can measure multiple instances of currents associated with GMDs or EMPs, as well as other information regarding the physical operation of key assets—such as other electromagnetic phenomena (voltage, current, electric or magnetic fields), pressure, strain, displacement, acceleration, temperature, or other physical phenomena. The system thereby generates the information necessary for system operators to monitor key system assets for potentially harmful currents and other physical phenomena, including those that may be indicative of a system disturbance, and take appropriate action in response.

SUMMARY OF THE INVENTION

An aspect of the invention is directed to a system of sensors for measuring currents produced by geomagnetic disturbances and electromagnetic pulses in materials or structures, and other physical phenomena.

The sensors used in the system described herein use fiber optic sensor technology to measure the currents associated with GMDs and EMPs within a material or structure of interest, for multiple measurements of the same phenomena at different locations, or for the measurement of different physical phenomena, such as pressure, strain, other electromagnetic phenomena (voltage, current, electric or magnetic fields), displacement, acceleration, temperature, or other physical phenomena) at a common structure or at multiple locations. While the sensors used in the system disclosed herein present several embodiments designed to isolate for measurement of the direct currents and quasi-direct currents associated with GICs and EMPs, the fiber optic sensors share common characteristics. The fiber optic sensors used in the system to measure other physical phenomena also share common characteristics, with modifications for each type of physical phenomena to be isolated and measured.

The sensors each include an optical fiber bundle having a transmitting fiber and at least one receiving fiber. This fiber probe is then placed adjacent to a reflective surface that is part of or attached to a material. A housing may be included, and may be affixed to the optical fiber bundle at a first end and to the reflector body at a second end. The sensor can have one transmitting fiber and one receiving fiber, or can have one transmitting fiber and a plurality of receiving fibers. The reflective surface is spaced apart from the ends of the fibers and positioned so that light, transmitted through the transmitting fiber, is reflected by the reflective surface into at least one receiving fiber. A light sensing element is coupled to the second end of the at least one receiving fiber, so that in operation light from a light source, launched into the transmitting fiber, propagates through the fiber and emerges at the end, propagates a short distance from the end of the fiber, and is reflected at least partially by the reflector body back into the receiving fibers. The reflected light then returns through the receiving fibers, and is detected by a light sensing element.

In operation, the introduction of current to the sensor (whether AC or DC current for a current sensor, or other physical effect in the case of other sensors) causes a displacement in the material, which causes a change in the distance between the fiber end and the reflective surface, modulating the amount of light received in the receiving fiber. The change in distance between the fiber ends and the reflective surface modulates the amount of light received by the light sensing element. The intensity of the light received is therefore modulated in relation to the physical effect of interest. Each sensor is constructed in order to isolate for the physical phenomena to be measured (here, electric currents, particularly those with a very low frequency) but other fiber optic sensors may be used in the system to measure other electromagnetic phenomena (voltage, current, electric field, magnetic field), pressure, acceleration, strain, temperature, displacement, or other physical phenomena. In each sensor application, the phenomena is measured indicated by the displacement of the material in response to the phenomena, and the displacement of the material is measured by the amount of light detected by the light detecting element.

The system disclosed presents an approach whereby fiber optic sensors are used to measure currents in addition to taking measurements of other physical phenomena of interest, such as other electromagnetic phenomena (voltage, current, electric and magnetic fields), static or dynamic pressure, strain, displacement, temperature, or other physical effects. For example, a system of multiple fiber optic sensors allows for current monitoring on the transformer neutral simultaneously with other measurements, such as the temperature of the transformer which may rise to dangerous levels during a GMD event as a result of transformer core saturation, a phenomena which can ultimately lead to permanent damage to transformer windings. Alternatively, voltage measurements can be taken using a fiber optic voltage sensor, allowing for measurement of changes in reactive power, which are associated with GMD events, allowing for mitigation measures to be implemented. The system also allows for the simultaneous measurement of both the direct and quasi-direct currents associated with a GIC and alternating currents ("AC"), with the AC measurement being indicative of other potential problems (such as a phase imbalance) on the electrical system. The combination of current measurements from a fiber optic sensor, combined with other measurements of physical effects from other fiber optic sensors, provides multiple data points that may be indicative of the presence of a GIC and other useful operational information that can be used to reduce the risk of potential damage from such an event.

Because of the number of sensors that may be necessary or desirable in a system or application, it is further advantageous to multiplex the sensors in order to reduce the number of components necessary to construct the system. Multiplexing of the sensors can be achieved at multiple points within the sensor system, such as by using a single current source to drive multiple light sources, or a single light source to drive multiple sensors, further reducing costs. Embodiments of the multiplexed sensor system can be constructed so as to measure physical effects at different locations and/or take different kinds of measurements of physical effects at the same location or approximately the same location. Creating a system of sensors allows for the measurement of GICs and EMPs at several locations, or taking different kinds of measurements at the same or approximately the same location, or any combination thereof.

The multiplexed sensor system can be used to detect multiple instances of a common electromagnetic phenomena, such as a DC or quasi-DC current, or in combination with other measurements, such as other electromagnetic phenomena, strain, pressure, temperature, displacement, or other physical effects. A system of sensors may also be constructed so as to measure GICs or EMPs at a common location, which allows for monitoring of the electric power system in response to such events, enabling a range of mitigation approaches to be deployed. These measurements can be of the same phenomena at the same or approximately the same location or, using a system of such sensors, at multiple locations of interest, such as in an electrical substation with multiple transformers.

DETAILED DESCRIPTION OF THE INVENTION

Figure 1:
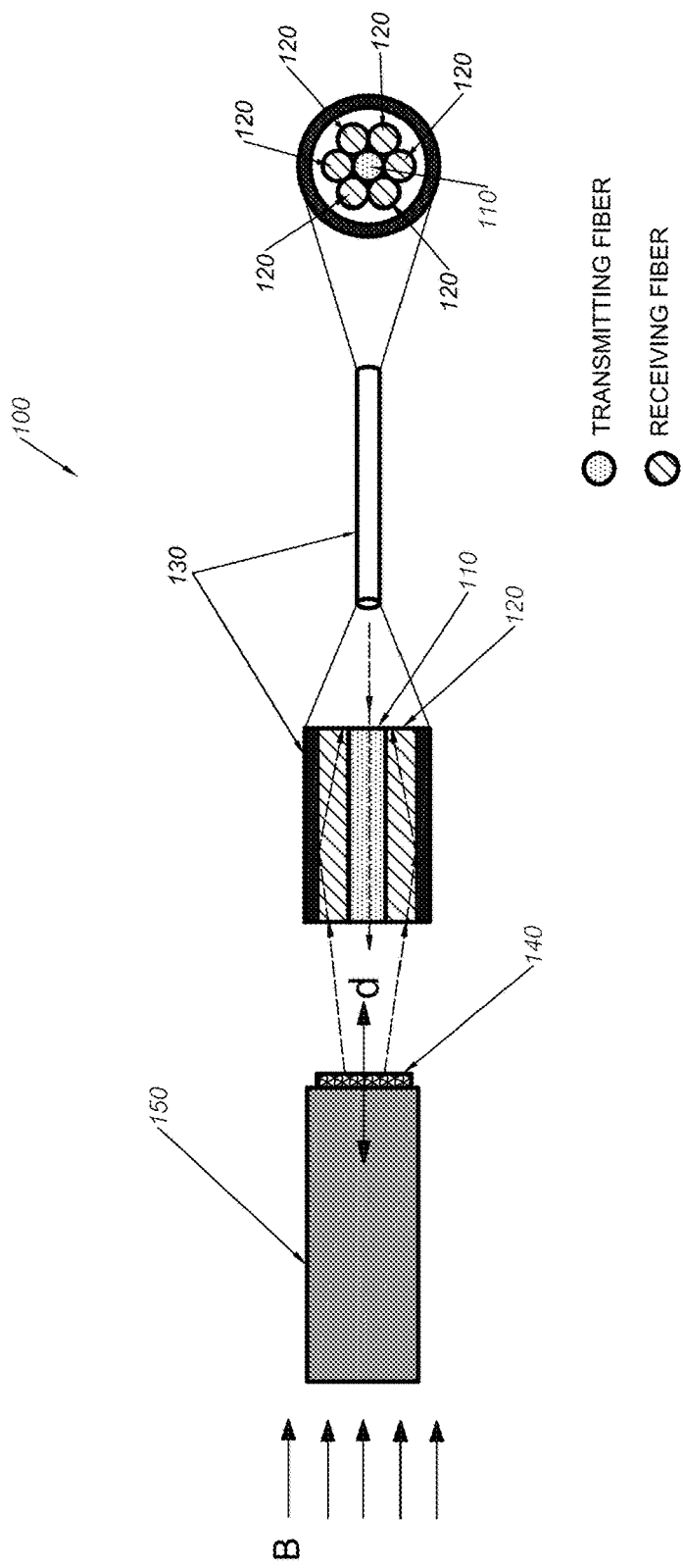
FIG. 1 shows an example embodiment of a fiber optic sensor for measuring currents used in the system according to the present invention.

An aspect of the invention is directed to a system of fiber optic sensors for measuring in materials or structures of interest that may be caused by GMDs or EMPs, and particularly the measurement of low frequency currents and other physical phenomena. The system uses fiber optic sensors to measure electromagnetic phenomena within multiple a material or structure of interest, such as an electrical circuit, and allows for multiple measurements of the same phenomena at different locations. The system allows for using a common system to also measure other physical phenomena, such as electromagnetic phenomena (such as voltage, current, electric fields and magnetic fields), pressure, strain, displacement, acceleration, or temperature, either at a common location or structure or at multiple locations using a common system.

A potential application of the disclosed system would be for the monitoring of low frequency or direct currents and other physical phenomena at the grounded neutral of a wye configured power transformer, which is a primary point of entry for GICs into the electric power system, an effect exacerbated for high voltage transformers due to their lower resistivity. Measurements of other physical effects in addition to current provide useful information regarding the operating characteristics of the measured asset or assets, such as temperature or reactive power. Taken together, these inputs can offer system operators with key operating metrics, such as GMD intensity, GMD directionality, transformer temperature rise, and swings in reactive power, each of which is useful to electrical power system operators for monitoring purposes and allows for pro-active mitigation efforts to be undertaken to preserve system reliability and reduce the risk of damage to system equipment.

An Overview of the Effect of GICs and EMPs on Electric Power System Operation

Solar weather, due to activity on the Sun causes charged particles to be released into the solar system, which can eventually result in disturbances in the magnitude and direction of the Earth's magnetic field. Through Faraday's law of induction, a changing magnetic field density through a defined area, or a changing flux, results in an induced electromagnetic frequency (EMF). In the case of GICs, a geomagnetic storm interacting with the Earth's magnetic field over a geographic area induces electric fields at the Earth's surface. EMPs also have a very slow pulse, particularly in the E3 phase. The electric fields drive currents in the ground through electric system transmission lines, telecommunication cables, and pipeline networks.

The frequency of the current, which varies depending on several factors, is substantially lower than the operating frequency of the electrical grid (e.g. ~60 Hz in North America, 50 Hz in other parts of the world), giving it the characteristics of a direct current. Since the magnetic field changes slowly, the frequency of the current is very low (below 1 Hz); the induced current is expressed as a direct current ("DC") or "quasi" direct current.

GICs enter the power grid when a geomagnetic storm interacts with the Earth's magnetic field. The accumulated voltage difference between two low-impedance ground points in the power grid yields a current high enough to produce equipment damage and power system instability to power grids. These currents also cause half-cycle saturation in power transformers, resulting in increased transformer reactive power losses and the potential for system-wide voltage collapse. A primary point of entry for GICs into the electric grid is through the grounded neutral wire of wye connected power transformers, which provide a low resistance path for the GIC, an effect exacerbated in neutral connections at higher voltages due to their lower resistivity. Once induced into the electric system, GICs flow through other elements of the power system, such as transmission lines.

When these currents enter power system equipment and facilities they may produce major increases in system reactive requirements, equipment damage, and disruption of interconnected system operation. In electric networks, GICs can saturate and may damage some equipment, such as large power transformers, which can be difficult and expensive to replace. These quasi-DC currents can also disrupt the normal operation of the power system. In addition, the currents can create harmonics that can potentially resonate with inductances and capacitances in the power system, and can create voltages spikes that can lead to transformer failure as well as cause network equipment, such as voltage regulators and relays, to mis-operate resulting in system voltage swings and, consequently, adverse effects of the power transfer capability of lines. In other cases, harmonic blocking measures may be activated, thus preventing some relays from operating when they should, and the harmonics may cause trips that should not happen. Given the potential impact of a significant GIC or EMP event, there has been increasing emphasis upon the need for approaches that can accurately identify and measure the direct and quasi-direct currents associated with GICs and EMPs in order that system operators may take steps to mitigate their potential effects and coordinate a response with other system operators.

An Overview of Fiber Optic Current Sensors Employed in System

Fiber optic sensors can measure the direct and low frequency currents that are produced by GMDs and EMPs.

A fiber optic probe, comprising a transmitting fiber for transmitting light and at least one receiving fiber for receiving light is placed adjacent to a reflective surface, with space between the probe end and the reflective surface. The reflective surface is either a part of, or is attached to, a material that exhibits a physical displacement in response to an electromagnetic phenomena, here the presence of a current. The force exerted upon the material due to the introduction of the current causes a physical displacement of the material that can be measured. In operation, the introduction of a current to the sensor causes a displacement in the sensor's sensing element, which causes a change in the distance between the sensor's fibers and the reflective surface of the sensing element, modulating the amount of light received by the sensor's receiving fiber or fibers and the amount of light received by the light sensing element. The intensity of the light received is therefore modulated in relation to the intensity of the current of interest.

Fiber optic sensors can be constructed using different sensing elements in order measure different effects, such as pressure, electromagnetic phenomena, acceleration, temperature, displacement, strain, or other physical phenomena based upon the sensing element's properties and the construction of the sensor. For current sensors, the force that creates the displacement in the material that is measured by the probe can be produced by the Lorentz Force or the magnetostrictive effect. In both cases, the sensors utilize a material that is configured so as to experience a physical displacement in response to the force exerted upon it due to the current created by the GIC or EMP. In both cases, the physical displacement in the material is proportional to the magnitude of the current applied to the material and can measure both AC and DC. The displacement in the material causes a change in the distance between the fiber optic probe and the reflective surface. The transmitting fiber is coupled to a light source and the receiving fiber or fibers are connected to a light sensing element that, in operation, the displacement of the material causes the light transmitted through the transmitting fiber to be reflected into the receiving fibers with an intensity that is modulated in a manner proportional to the displacement experienced by the material in response to direct or quasi-direct current produced by the GIC or EMP phenomena.

While each of the sensors disclosed herein is constructed in order to isolate for the measurement of currents created by GICs and EMPs, these sensors may be used in combination with the sensor to measure voltage, current, electric field, magnetic field, pressure, strain, acceleration, temperature, displacement, or other physical phenomena of interest, at the same location or at multiple locations, to acquire other useful information.

The fiber optic current sensor used in the system may measure the displacement in a material that is produced by the phenomena known as the magnetostrictive effect. The magnetostrictive effect refers to the property of certain materials to exhibit a physical displacement when exposed to a magnetic field or current. Specifically, these materials exhibit physical strain when a magnetic field is applied to the material, causing the material to experience a change in its physical dimensions. The displacement of the material in response to the magnetic field is proportional to the strength of the applied magnetic field. See, e.g., Beeby et al., *MEMS Mechanical Sensors* at p. 109 (2004 ed.). A magnetic field can be created by the flow of electrical current in a conductor, as explained by Ampere's Law, and thus, a current to be measured can be used as the magnetic field that causes the magnetostrictive material to experience a physical displacement.

Displacement of the magnetostricitve material is a function of the intensity of the applied magnetic field (or current) and the particular properties of the magnetostricitve material used. The property of the material can be quantified by its magnetostricitve coefficient, which is indicative of the extent to which the material will change in length as the magnetic field applied to that material increases. Magnetostrictive materials include nickel, cobalt, galfenol, terfenol-d, and other ferromagnetic materials and alloys, although many such materials are known. Each of these materials has known magnetostricitve properties, referred to alternatively as magnetostricitve strain coefficients or strain constants. These coefficients describe the proportional relationship between the magnetic field applied and the mechanical displacements produced in the material.

The relationships between an applied magnetic field and the corresponding displacement in a magnetostricitve element's length are:

$$\Delta l = d_{33} H l \qquad \text{Equation 1.}$$

Where:
  $\Delta l$: change in length of magnetostricitve element
  $d_{33}$: magnetostricitve strain coefficient of material in direction of magnetic poling
    $d_{33}$ is the induced strain in the material in direction 3 per unit of magnetic field applied in direction 3.
  H: magnetic field
  l: length of magnetostricitve element The magnetostricitve strain coefficients of many materials are known properties, whereby the change in material length is proportional to the strength of the magnetic field. Since the magnetostricitve coefficients and geometric dimensions of the selected material are known, and the direction of the magnetic field can be set in a desired orientation, an applied magnetic field or current will produce a displacement in the magnetostrictive material in a linear relationship.

In operation, a magnetic field is introduced to the magnetostrictive element, either by placing the sensor directly into a magnetic field of interest or creating a current in the element through the use of a coiled current-carrying wire. In response to the magnetic field, the magnetostrictive material experiences a physical displacement in a given direction, consistent with the displacement equation described in Equation 1. In parallel, light is launched from the light source into the transmitting fiber, propagates through the transmitting fiber, emerges at the opposite end, propagates a very short distance, and is reflected by the reflective surface of the magnetostrictive material into the receiving fibers, the light then propagates through the receiving fibers, and is detected by light sensing element. The displacement is measured by the fiber probe as the increase or decrease in the distance between the optical fiber and the magnetostricitve material will cause a change in the amount of reflected light received in the optical receiving fibers and sensed by the light sensing element. Thus, the fiber optic probe measures the displacement of the magnetostricitve material, which is proportional to current in the electromagnetic field of interest.

The displacement in the magnetostrictive material in a direction relative to the fiber probe causes a change in the amount of light reflected by the reflective surface of the magnetostrictive material and into the receiving fibers. The amount of displacement experienced by the magnetostrictive material is proportional to current flow. The increase or decrease in the distance between the optical fiber and the reflective surface will cause a change in the amount of reflected light received in the optical fiber and detected by the light detecting element. Thus, the intensity of the light coupled into the receiving fibers modulates in a proportional relationship to the magnetic field that is applied to the magnetostrictive material and is measured by the probe.

FIG. 1 shows an embodiment of an electromagnetic fiber optic sensor 100 featuring a fiber probe and a material that exhibits a physical displacement in response to a GIC or EMP, with the displacement caused by magnetostrictive effect described in Equation 1, which measures current and magnetic fields. A fiber bundle featuring a transmitting fiber 110 having a first and second ends is placed adjacent to a reflective surface 140. The first end has a polished finish and the second end is coupled to a light source (not shown). The sensor uses an LED emitting at 850 nm as the light source with a silicon PIN diode as the light sensing element (not shown). The fiber bundle also features a multitude of receiving fibers 120 disposed around the transmitting fiber with each receiving fiber having first and second ends where the first ends are also polished and the second ends are coupled to the light detecting element. The fibers are arranged as shown in the cross-section of FIG. 1, to form a multi-fiber bundle.

The fiber bundle is inserted into a tubing 130 so the fiber bundle is contained within the tube, forming a probe. The fiber probe is positioned such that the first end of the transmitting fiber and the first end of each receiving fiber is adjacent to the reflective side 140 of the magnetostrictive material 150 to be measured that exhibits a physical displacement when subjected to a magnetic field or current (which can be produced by a GIC or EMP current), with space between the first fiber end and the reflective side of the material.

The material 150 that exhibits a physical displacement in response to the current is a material with magnetostrictive properties, such as nickel, cobalt, galfenol, terfenol-d, or a magnetostrictive alloy. Here, nickel is chosen as the magnetostrictive element. The material chosen is polished (that is, the material and the reflector are part of the same body). However, the material 150 can have an attached reflective body or coating, layer, or other reflective material 140 that is comprised of a reflective material such as a metal (aluminum, beryllium, chromium, copper, gold, molybdenum, nickel, platinum, rhodium, silver, tungsten, and/or an alloy of any of these or other reflective metals).

In operation, a magnetic field, denoted "B", is introduced to the magnetostrictive material in a given direction. The introduction of a current in the material will cause the material to exhibit the magnetostrictive effect, whereby the material experiences a physical displacement dependent upon the magnetic poling of the material and the magnetostrictive constant of the material. Here, as shown in FIG. 1, the force exerted upon the material results in displacement in the material towards the direction of the fiber optic probe, the force creating a physical displacement consistent with the displacement equation described in Equation 1. In parallel, light from the light source is launched into the transmitting fiber propagates through the transmitting fiber, emerges at the opposite end of the probe, propagates a short distance, and is reflected by the reflective surface of the material and into the receiving fibers, the light then propagates through the receiving fibers, and is detected by light sensing element.

The intensity of the light coupled into the receiving fibers modulates in a proportional relationship to the current that is passed through the magnetostrictive material and is measured by the sensor. This embodiment allows for measurement of a current in close proximity to the current-carrying conductor of interest, consistent with the principles discussed in Equation 1. Alternative sensor embodiments, with modifications for particular desired applications, are envisioned whereby the current is enhanced in the magnetostrictive material by the use of a coiled wire carrying the current. Additional alternatives include the additional use of a permanent or electro-magnet to create a shift in the characteristics of the magnetic field being measured and shift the output of the measured displacement into a linear range of measurement.

The type of fiber employed in the embodiment shown in FIG. 1 is generally an optical fiber having a core that is preferably made of glass. The cladding may be plastic or some other material. In a preferred embodiment fibers with a high numerical aperture are used. Generally fibers with a numerical aperture of >0.2 are employed. A high numerical aperture provides for greater efficiency in the coupling and transmission of light. The fiber may be a multimode fiber. Multimode fibers and fibers featuring high numerical apertures are not required, however. When employed in systems that have a great distance between the source and the reflective side of the material a fiber having a high numerical aperture is not critical.

Generally, multimode fibers with a combination of a thick core and thin clad fiber are preferred. Light incident on clad is lost, thus the core needs to be as close in proximity to the outer perimeter of the clad is possible to ensure efficient light coupling in the core. Thus, light coupling within the fiber is maximized with a thick core thin clad structure. This however, does not limit the use of fibers in this device to multimode fibers with thick core thin cladding structures. Varying degrees of effectiveness and light coupling are possible with other fiber configurations.

In a preferred embodiment, one end of the fiber has a polished finish and the opposite end of the transmitting fiber is coupled to the light source (not shown). The first ends of the receiving fiber or fibers also feature a highly polished finished, with the opposite ends coupled to the light sensing element (not shown). The optical fiber features a 200 μm glass core, and 230 μm plastic clad, a 500 μm Tefzel plastic coating, and a numerical aperture of approximately 0.37. The plastic coating is stripped and epoxy is applied to the fibers so the fibers form a symmetric bundle. The fiber bundle is inserted into a tubing 130 so the fiber bundle is contained within the tube, forming a probe. The fiber probe is positioned such that the first end of the transmitting fiber and the first end of each receiving fiber is adjacent to the reflective surface with space between the first fiber end and the reflective surface. As explained in other paragraphs, a broad dynamic sensitivity maximum has been found for a probe-reflector separation between 180 and 250 μm for this embodiment, but other separations may be preferable based upon the construction of the probe (i.e. –the number of fibers utilized). In another embodiment a single fiber may be used as both the transmitting and receiving fiber. In yet another embodiment, the fiber probe may contain a single transmit fiber and a single receive fiber. However, any combination of fibers may be used to form the probe.

The light sensing element is at least one silicon PIN diode. LEDs represent an efficient way to launch light into the fiber probe. LEDs are generally low cost and feature low noise operation in a fiber system. LEDs also tend to be very stable over extended periods of time. Laser diodes may also be used, although they increase the expense and complexity of the system. Current laser diodes also tend to introduce additional noise to the sensor package. One suitable LED for use as a light source is an Optek OPF370A LED emitting light at 850 μm wavelength. In this embodiment the light source and the sensing element for the received light are both coupled to the fiber end. The light is launched from the fiber into the reflective surface and is reflected back into the same fiber.

In an alternative sensor embodiment, the displacement measured by the fiber probe that is indicative of current is produced by the Lorentz Force. In this embodiment, the fiber optic probe measures the displacement in a material that is caused by the electromagnetic phenomena described as the Lorentz Force, the displacement being indicative of the electrical current flowing through the material. The Lorentz Force equation relates the direction and force applied to a material that is carrying a current. The force experienced is proportional to current and the magnetic field and in a direction perpendicular to the magnetic field and the direction that the electric current is flowing (a concept also explained by the "right hand rule"). The Lorentz Force Law can be expressed as follows:

$$\vec{F} = i_a l = \vec{B}$$ Equation 2.

Where:

$\vec{F}$ =force $i_a$ =current in the conductor l=length of the conductor $\vec{B}$ =flux density The current flowing through a conductor, when passed through a magnetic field, creates a force which acts to physically displace the conductor in a direction perpendicular to the direction of the current. Using this principle it is possible to construct a sensor that isolates for the measurement of current, by setting the length of the conductor to a predetermined length, and holding the flux density of the magnetic field constant by the use a local magnet set in a fixed location proximate to the current carrying conductor. As a result, a current carrying conductor is passed through the magnetic field will experience a force perpendicular to the direction of the current, with the force expressed as a linear response to the magnitude of the current, with the force being proportional to current.

The force exerted upon the conductor creates a physical displacement in the material in a direction perpendicular to both the magnetic field and the direction of the current. For example, if the current carrying element is configured as a conductor beam that is supported at both ends, the force exerted upon the beam will be uniform, causing the beam to displace in a known manner. This displacement in the conductor in response the Lorentz Force can be measured by the fiber optic probe. Thus, the Lorentz Force phenomenon causes physical displacement of the conductor carrying a current in a given direction consistent with the right hand rule. The displacement is measured by the fiber optic probe and such displacement is proportional to current, under the Lorentz Force Law of Equation 2.

Depending upon the configuration selected, the introduction of a current in the conductive wire of the sensor will cause the conductor to experience the Lorentz Force in a known direction depending upon the direction of the current and the orientation of the magnetic field. The force exerted upon the conductor results in displacement in the wire towards the direction of the fiber optic probe, the force creating a physical displacement consistent with the displacement equation described in Equation 2 and operating under the same displacement measurement principles described above.

Figure 2:
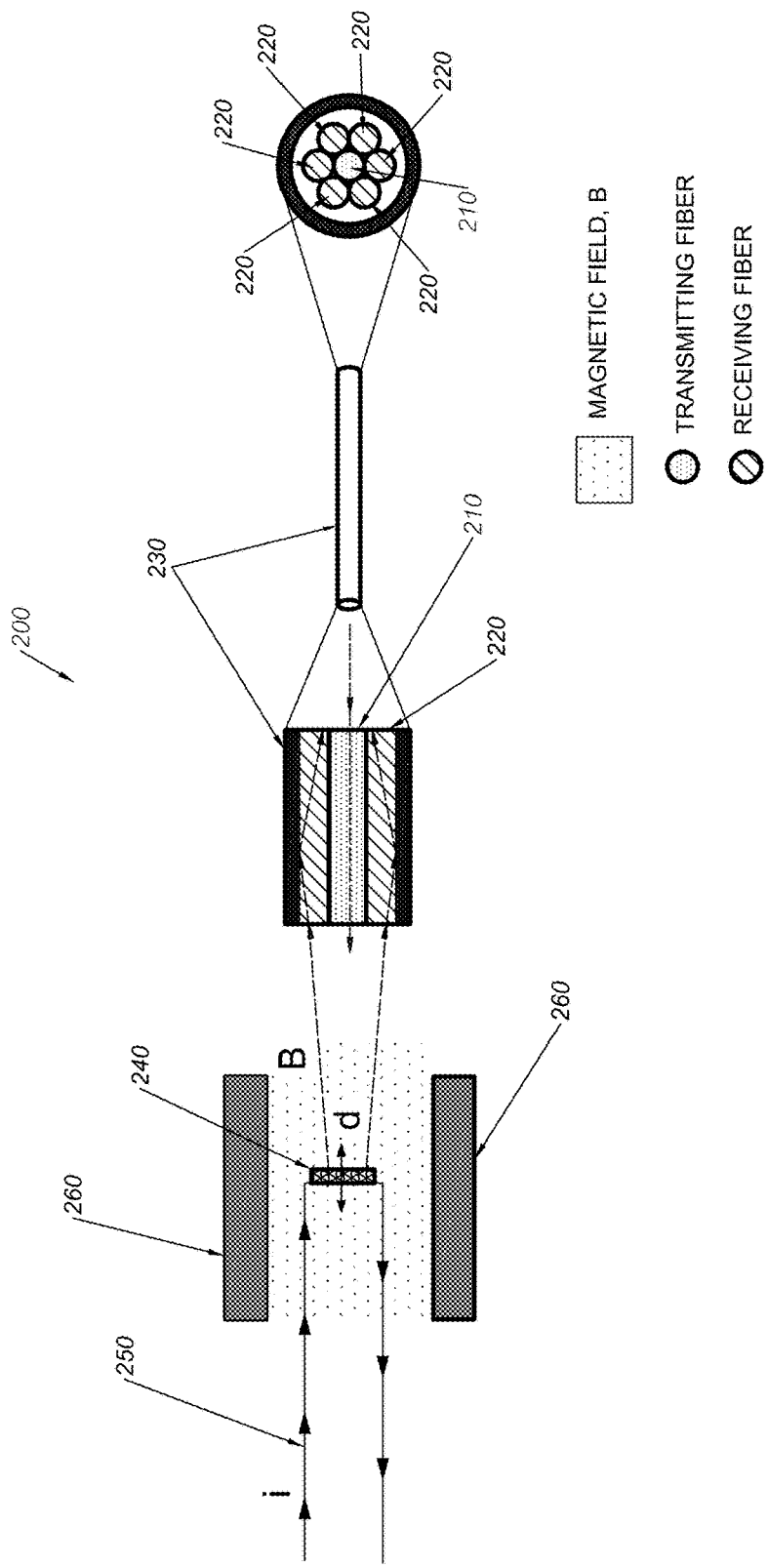
FIG. 2 shows an example embodiment of a fiber optic sensor for measuring currents used in the system according to the present invention.

FIG. 2 shows an embodiment of a fiber optic sensor 200 featuring a fiber probe and a material that exhibits a physical displacement in response to current, with the phenomena being explained by the Lorentz Force described in Equation 2. A fiber bundle featuring a transmitting fiber 210 having a first and second ends is placed adjacent to a reflective surface 240. The first end has a polished finish and the second end is coupled to a light source (not shown). The fiber bundle also features a multitude of receiving fibers 220 disposed around the transmitting fiber with each receiving fiber having first and second ends where the first ends are also polished and the second ends are coupled to a light detecting element (not shown). The fiber bundle is disposed within a tubing 230 such that the first end of the transmitting fiber and the first end of each receiving fiber is adjacent to the reflective side of the material 240 to be measured that exhibits a physical displacement when subjected to a magnetic field, with space between the first fiber end and the reflective side of the material. Here, the material to be measured is a conductor 250 which is itself reflective. However, the material can have an attached reflective body 240 or coating, layer, or other reflective material that is comprised of a reflective material such as a metal (aluminum, beryllium, chromium, copper, gold, molybdenum, nickel, platinum, rhodium, silver, tungsten, and/or an alloy of any of these reflective metals).

In this embodiment, the material that exhibits a physical displacement is a conductor 250 comprised of phosphor bronze. Two magnets 260 are used to create a magnetic field, denoted "B", between the magnets at the area where the fiber probe and the conductive wire are situated adjacent to each other. In this embodiment, a permanent magnet of samarium cobalt (SmCo) is used, although any approach may be used to create the magnetic field, including the use of permanent magnets or electromagnets. The conductor is positioned such that a portion of the conductor 250 runs perpendicular to the direction of the magnetic field created by the samarium cobalt magnets (consistent with the right hand rule, resulting in a displacement in the current-carrying conductor in a known direction relative to the magnetic field and direction of the current). In operation, a current, denoted "i", is run through the conductor in a given direction. In the presence of a magnetic field caused by the permanent magnets, the introduction of a current in the conductive wire will cause the conductive wire to experience the Lorentz force in a known direction depending upon the direction of the current and the orientation of the magnetic field. The displacement created modulates the light received by sensor and detected by the light sensing element, with the modulated light being indicative of current.

In an alternative embodiment of a current sensor, the sensor similarly measures the displacement in a material that is produced by the electromagnetic phenomena described as the Lorentz force, the displacement of the material being indicative of the electrical current applied to the material. In this embodiment, however, the electrical current to be measured is split between two conductors which are arranged adjacent and parallel to each other. For this embodiment, the displacement of the material in response to electromagnetic phenomena is based upon the effect explained under Ampere's Law in addition to the Lorentz Force phenomena discussed in Equation 2. Using the principles set forth in Equation 2, the force generated by this electromagnetic phenomena can be expressed as a displacement of the conductors carrying the current in a given direction due to the Lorentz Force.

In this embodiment, two conductors are used, the conductors carrying a common current, and the displacement of the two conductors perpendicular to the direction of the current is proportional to $$\left(\frac{1}{2}i\right)^2,$$

where the current is split proportionally between the conductors, or, alternatively, $i_a i_b$ for other embodiments where current is split other than proportionally. Thus, under the same principles set forth in the embodiment discussed in FIG. 2, the force exerted the Lorentz Force is expressed as a displacement of a conductive material carrying a current that can be measured using the fiber optic probe.

Figure 3:
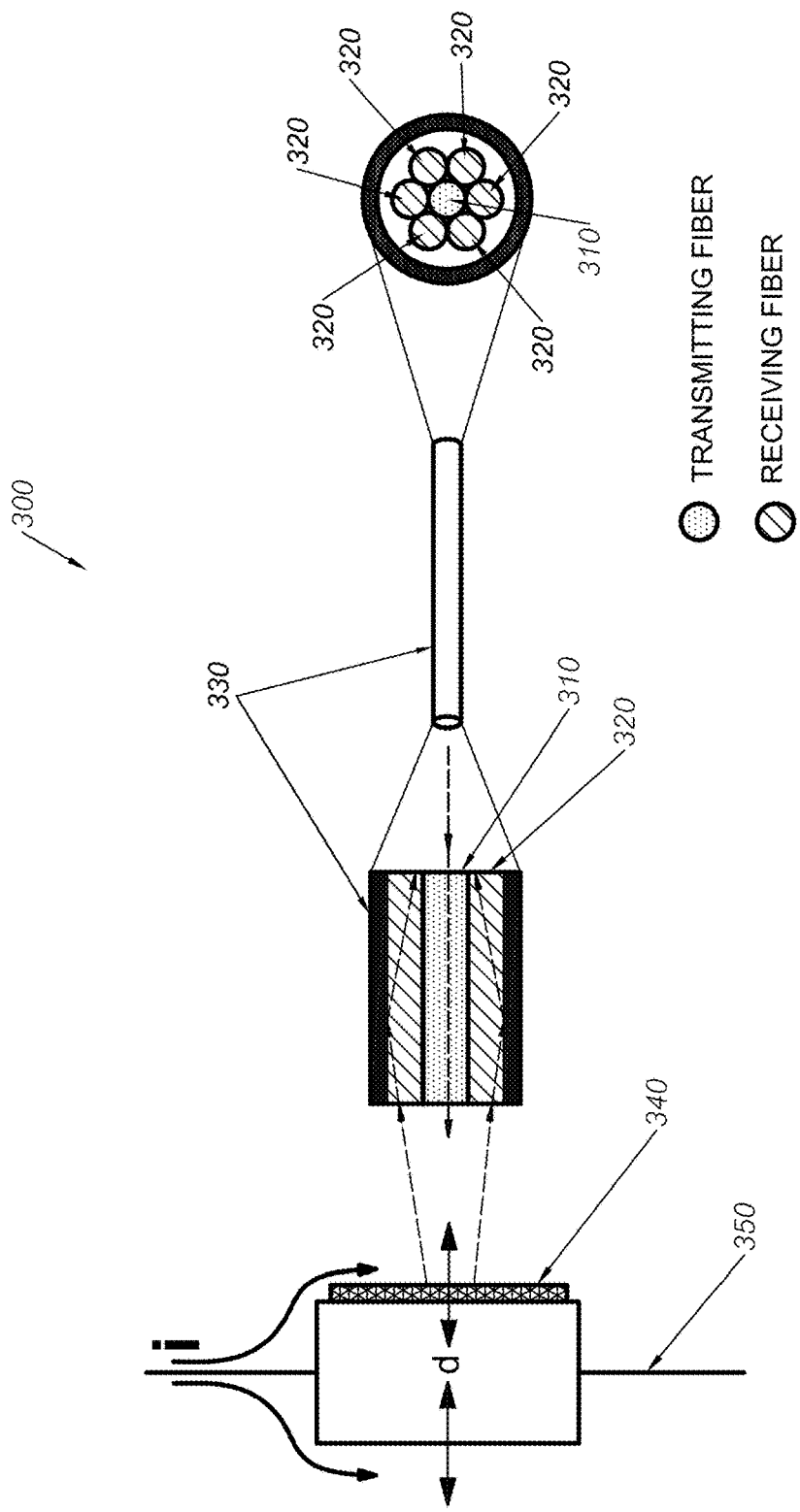
FIG. 3 shows an example embodiment of a fiber optic sensor for measuring currents used in the system according to the present invention.

FIG. 3 shows an embodiment of a fiber optic current sensor 300 featuring a fiber probe and a material that exhibits a physical displacement in response to an electromagnetic field, with the displacement caused by Lorentz Force described in Equation 2, which is constructed to measure current and magnetic fields. A fiber bundle featuring a transmitting fiber 310 having a first and second ends is placed adjacent to a reflective surface 340. The first end has a polished finish and the second end is coupled to a light source (not shown). The sensor uses an LED emitting at 850 µm as the light source with a silicon PIN diode as the light sensing element (not shown). The fiber bundle also features a multitude of receiving fibers 320 disposed around the transmitting fiber with each receiving fiber having first and second ends where the first ends are also polished and the second ends are coupled to the light detecting element. The fiber bundle 330 is constructed and arranged as described in FIGS. 1 and 2 above, to form a multi-fiber probe. The fiber bundle is inserted into a tubing 330 so the fiber bundle is contained within the tube, forming a probe. The fiber probe is positioned such that the first end of the transmitting fiber and the first end of each receiving fiber is adjacent to the reflective side 340 of the material 350 to be measured that exhibits a physical displacement when subjected to a current, with space between the first fiber end and the reflective side of the material.

The material 350 that exhibits a physical displacement in response to current is a polished copper conductor, specifically a copper bus bar machined such that a small space is created between two equal sections of bus bar, it will be appreciated however, that any conductor may be used, and that the conductors may be spaced at different distances and at different relative thicknesses depending upon the requirements of a particular application. Here, the material chosen, copper, is itself reflective when polished (that is, the conductor and the reflector are part of the same body). However, the material 350 can have an attached reflective body or coating, layer, or other reflective material 340. In operation, a current, denoted "i", is run through the conductor in a given direction. The introduction of a current in the conductor will cause the conductor to experience the Lorentz force in a direction perpendicular to the direction of the current, displacing the conductive element. Here, as shown in FIG. 3, the force exerted upon the conductor results in displacement in the conductor towards the direction of the fiber optic probe, the force creating a physical displacement consistent with the displacement equation described in Equation 2. Thus, under the same principles set forth in the embodiment discussed in FIG. 2, the current will cause a displacement in the conductors carrying the current in a given direction, which can be measured by the fiber optic probe.

As with the magnetostrictive sensor described in FIG. 1, the amount of displacement experienced by the conductor element of these alternative embodiments utilizing the Lorentz Force principle is proportional to current flowing in the conductor of interest, with the light received by the sensor's receiving fibers modulated in relation to the current of interest. Each of the sensor constructions described in FIGS. 1 to 3 can measure alternating and direct current using this technique.

The sensors can include a multitude of fibers, or the fiber probe may contain a single transmit fiber and a single receive fiber. However, any combination of fibers may be used to form the probe. The fiber optic probe used in the sensor system described herein may comprise consist of one or more optical fibers. The measurement sensitivity of sensors using such a probe can be determined and set by establishing a set probe-reflector distance depending on the method of fiber optic probe construction employed, as taught in the U.S. Government Patents and the Electromagnetic Phenomena Sensor Patent Application. It will be appreciated, however, that any combination of number of fibers may be used to construct the probe and select the distance between the probe and the reflector based upon the concepts described. Although this invention has been described in relation to the exemplary embodiments thereof, it is well understood by those skilled in the art that other variations and modifications can be affected on the preferred embodiments without departing from the scope and spirit of the invention as set forth herein and within the claims.

Description of an Operation of the Fiber Optic Sensor System

The fiber optic sensors described above provide accurate measurement of GMD- and EMP-produced currents. Given the risk that these currents may pose to the reliable operation of electric networks and equipment, it may be desirable that multiple system components be monitored for the presence of these currents. It may also be desirable that multiple sensors be used in order to take multiple current measurement, or measurements of other physical phenomena, within an area of interest (such as within multiple pieces of equipment in a substation installation) that are indicative of a GMD event or other physical phenomena.

Alternatively, or in addition, it may be desirable to use a combination of fiber optic sensors to measure multiple different kinds of physical phenomena at the same or different areas, such as in a system in which GICs are measured in combination with the core temperature of a transformer. Measurements can also include strain, pressure, acceleration, temperature, displacement, electromagnetic phenomena, or other physical phenomena. These sensors may be combined with the fiber optic current sensor discussed above to construct a system of fiber optic sensors in order to measure multiple phenomena on or within a structure of interest.

A system can be constructed that has the ability to detect direct or quasi-direct currents by placing the sensor in series with the grounding neutral of a power transformer, with additional sensors that may be added to provide additional measurements regarding the currents being experienced simultaneously at other system elements, such as other transformers within the substation, or other system elements such as transmission lines. The sensor system can also be used to detect both the direct and quasi-direct currents associated with GICs and EMPs in addition to the AC current generally associated with the operation of most electric power networks.

In a preferred embodiment, a fiber optic current sensor can be used in combination with other fiber optic sensors, such as temperature sensors, to monitor the transformer for GIC-induced heating that could result in loss of life or potential failure during, or due to, the solar storm. A multiple sensor system may also be used to compensate for potential sources of noise in the measured signals. For example, two sensors can be located near each other so they are exposed to approximately the same temperature, with one of them being exposed to a reference signal and the other exposed to the signal to be sensed. The detected results can be compared to eliminate or minimize noise effects, such as those that may arise due to temperature changes, or account for the temperature dependency of the electrical conductors used in the circuits of interest. Other multiple sensor compensation approaches may also be employed. Alternatively, GIC sensors could be used in combination with fiber optic electromagnetic phenomena sensors, such as voltage sensors to monitor for voltage fluctuations, changes in reactive power upon the system, or the introduction of harmonics that may be caused by a solar storm.

The collection of information regarding the presence and intensity of currents upon certain electrical system components can be used by system operators to implement mitigation procedures in the event of a geomagnetic disturbance, such as GIC blocking or the tripping of equipment conducting or affected by the GIC. The information can also be communicated on a wide-area basis to other utilities or reliability-tasked entities, allowing for real-time situational awareness of the threat across entities and allowing system operators to respond in a coordinated fashion. Given the construction of the GIC sensor probes, and the use of common electro-optics with other fiber optic sensors, the GIC sensors can share electro-optics, allowing for multiple fiber optic sensors to be used in a common system.

Fiber optic sensors measure each phenomena with a high degree of accuracy and, in this embodiment, can be incorporated into a system whereby multiple phenomena can be measured simultaneously using a common system. The outputs from the sensors can be maintained in an analog state or can be converted to a digital signal for processing and communications.

Figure 4:
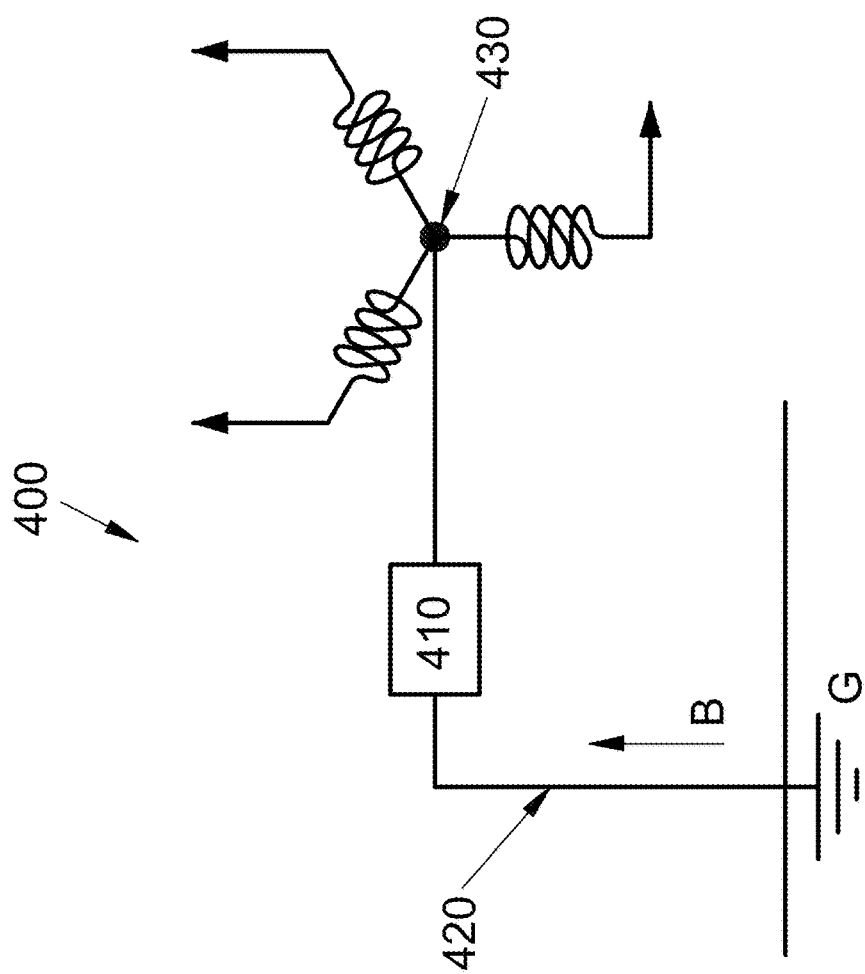
FIG. 4 shows a line drawing of a fiber optic sensor system in operation, installed upon the neutral of a power transformer according to the present invention.

FIG. 4 shows a line drawing of an embodiment of the sensor system in operation, wherein the sensors included in the system are affixed to the grounded neutral wire of a wye connected power transformer. In FIG. 4, the sensor (which can be any of the current sensors described above) is placed within an enclosure 410 that is connected to a conductive bus bar or other conductor in series along with the neutral conductor monitored 420. The enclosure 410 houses at least one current sensor, which measures the currents introduced through the grounded neutral 420. Other fiber optic sensors, such as those configured to measure strain, pressure, acceleration, temperature, displacement, electromagnetic phenomena, or other physical measurements, may be included in the enclosure 410 to measure for other physical phenomena of interest. As shown in FIG. 4, the sensor or sensors are placed between the grounding neutral (denoted "G") and the neutral connection 430 of a wye-configured three-phase power transformer.

The introduction of a current into the neutral conductor 420 causes the current sensor within the enclosure 410 to experience a displacement in the material to be measured and causes the fiber probe-reflector distance to increase or decrease, as described for each of the embodiments described above. As the probe-reflector distance changes, the amount of light received in the receiving fibers changes, which is proportional to the current present on the transformer neutral. The modulated light is detected by a light sensing element where its output is indicative of the current present on the transformer neutral. Other fiber optic sensors within the enclosure 410 operate similarly, but measure a different physical phenomena, such as pressure, temperature, strain, electromagnetic phenomena, displacement, or acceleration, and transmit the modulated light to a light sensing element. The outputs of the light sensing element can be maintained in an analog state or can be converted to digital signals for further processing or for communications purposes. Note that the light sensing element and other electronics may be located remotely from the enclosure 410 and conductor 420. Note also that return path of the sensor to the system electronics is di-electric in nature, alleviating a potential safety hazard and making the system EMI resistant.

Figure 5:
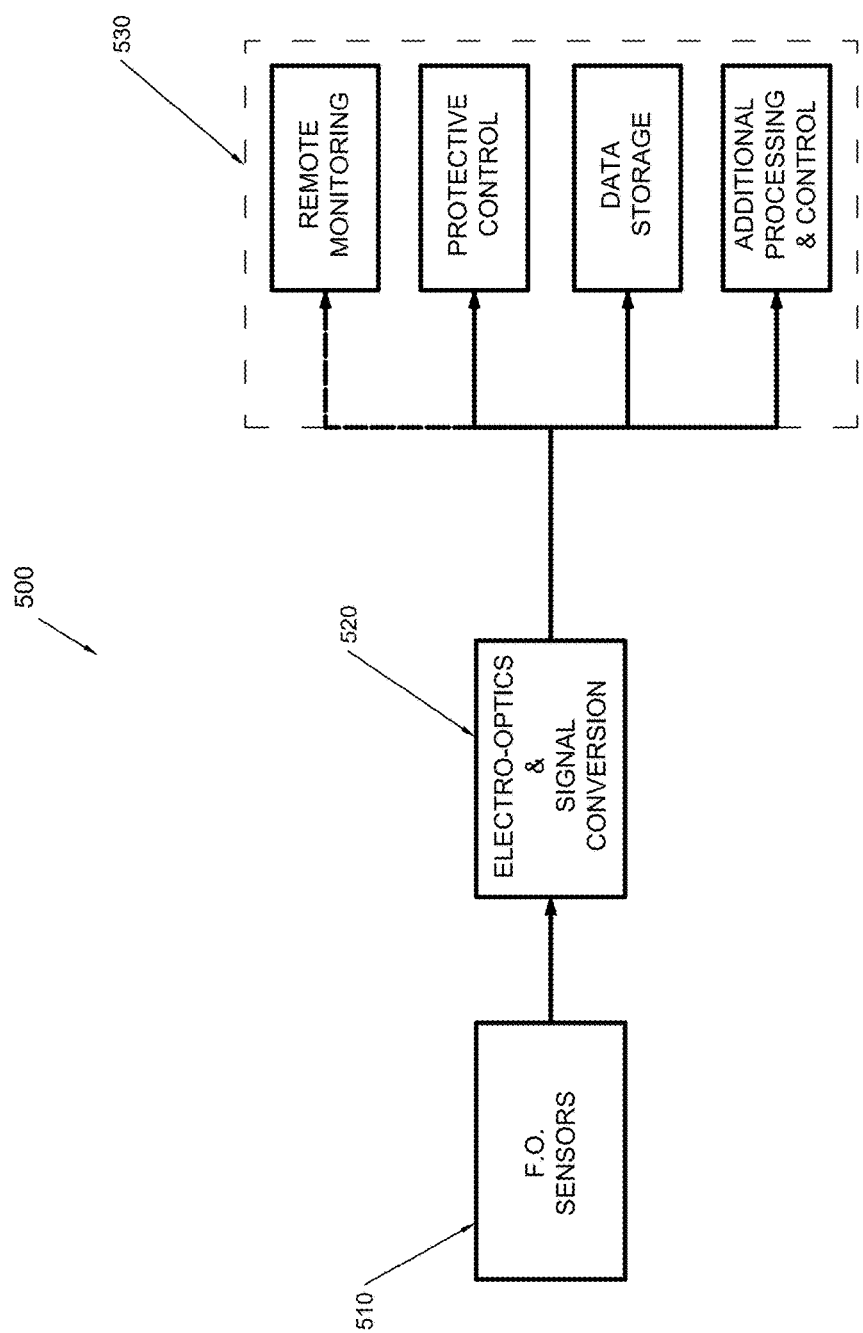
FIG. 5 illustrates the flow of information associated with the fiber optic sensor system according to the present invention.

FIG. 5 illustrates the flow of information of the sensor system, specifically the acquisition of measurements of physical phenomena using the fiber optic sensors and the use of that information to enable a range of applications or decisions. Referring to FIG. 5, in operation, the fiber optic sensors 510 detect current and take other measurements of physical phenomena, all of which are indicated by the modulation of light in response to the displacement of the sensors' sensing element. The modulated light is transmitted from the sensors to an electro-optics device 520 containing a light sensing element for each of the sensors used in the system. The light sensing element detects the modulated light received from each of the fiber optic sensors. At this stage the amount of detected light can be translated into an electrical signal output, and can be retained in its analog form, or further converted to a digital form.

The output signals from the sensors can be used to drive a number of operations 530, provided here for illustrative purposes and without limitation. The output data can be sent to remote monitoring platforms via communications mediums which can use this information to monitor specific pieces of equipment or large portions of the electrical network across a wide area, and take mitigation approaches as appropriate. The signal outputs may be used to monitor locally for the presence of potentially harmful currents, using the signal to trigger automatic protective control or other mitigation actions designed to protect the electrical equipment and electrical system from potential harm. The outputs may also be stored locally or remotely in order to conduct after-the-fact analyses of events or to validate models that may be used to estimate GIC flows and system impacts. Finally, additional processing and control functions may use the sensor outputs to monitor and control equipment and the electric power system on a dynamic basis, providing for greater system efficiency.

Figure 6:
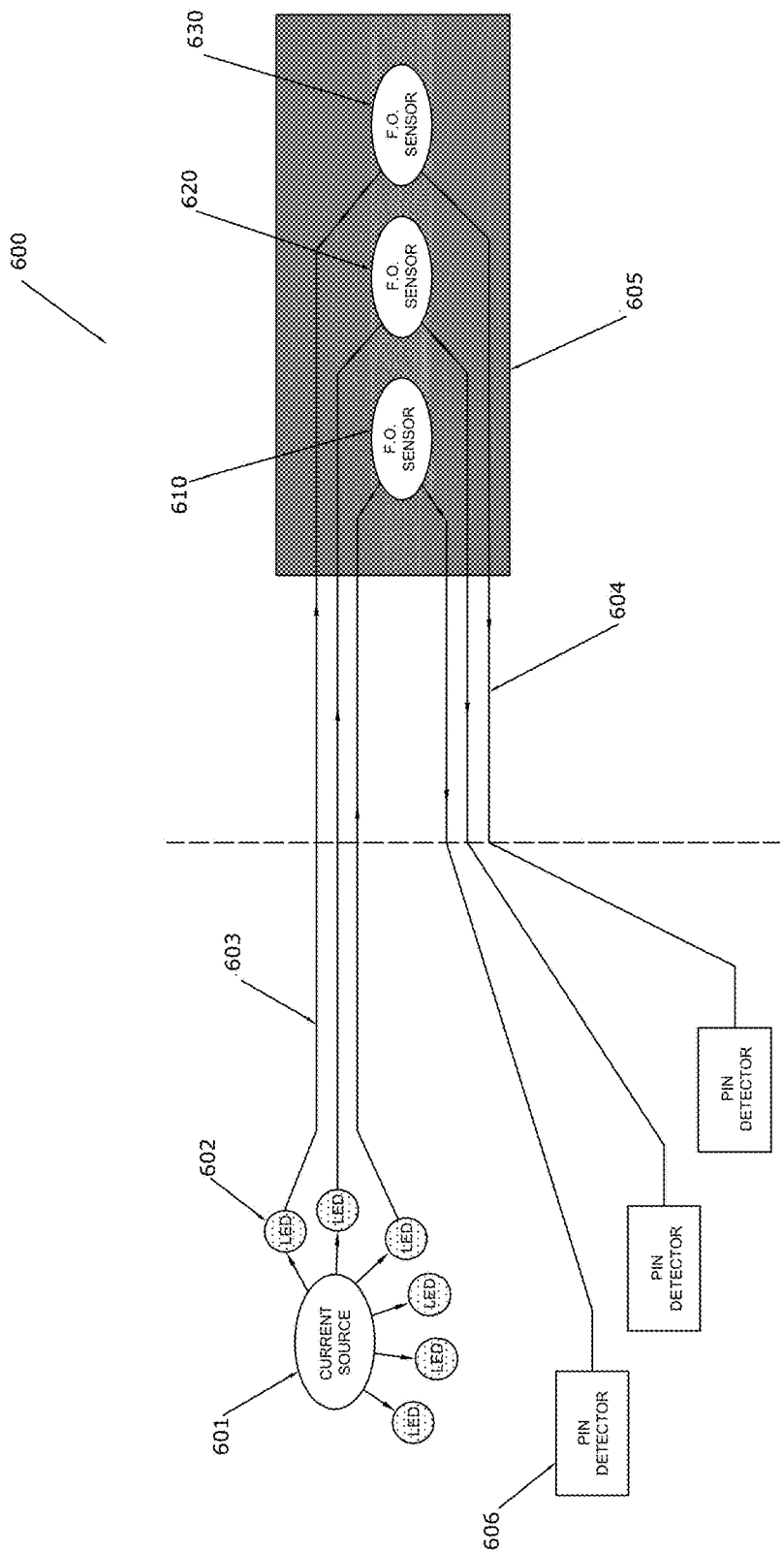
FIG. 6 illustrates an embodiment of a fiber optic sensor system according to the present invention.

Given the large number of sensors that may be necessary or desirable in a system, it is advantageous to combine them into a common system, thereby reducing the number of components necessary to construct the system. Multiplexing of the sensors can be performed at multiple points within the sensor system, further reducing cost and system complexity. FIG. 6 illustrates a fiber optic sensor system 600 arranged to measure current at several locations and/or take different kinds of measurements at the same location, such as current and temperature, or any other desired measurement of a physical effect, such as electromagnetic phenomena (such as voltage, current, electric field, magnetic field,), static or dynamic pressure, strain, and displacement, or acceleration. Here, the sensor system comprises a current source 601 supplying six light sources, here LEDs 602, and each LED supplying light to a single fiber optic sensor. Each LED is arranged to transmit light into a length of optical fiber 603 and each fiber providing light to a single sensor.

Each of the optical fibers 603 extends to a different sensor 610, 620, and 630 and serves as the transmitting optical fiber for that sensor. Receiving fibers of the sensors 604 receive the reflected light, as discussed in previous paragraphs related to FIGS. 1 to 3. Here, six fibers are used to receive the reflected light. The receiving fibers then transmit the light to the light sensing element, here PIN detectors 606. Alternatively, it is envisioned that the receiving fibers can be coupled to lengths of another wide diameter fiber via connector pairs for transmission to the light sensing element. Each of the light sensing element converts the received light from the fiber optic sensors to electrical signals. The electric signals can be converted from analog to digital outputs for signal processing. The output electrical signals from each of the light sensing element are proportional to the measured physical phenomena in the structure or material of interest.

The sensors 610, 620, and 630 can each be a seven-fiber current sensor described above. As discussed above, the measurement of currents experienced within various pieces of electrical equipment provides useful information to electrical system operators regarding the potential risk to facilities from a GMD event that may result in major increases in system reactive requirements, equipment damage, and disruption of electric power system operation. Alternatively, the sensors could be current sensors with a different number of fibers, or the sensors could include strain sensors, electromagnetic phenomena sensors, pressure sensors, acceleration, temperature sensors, or other intensity modulated fiber-optic sensors, or a combination of any of these kinds of sensors.

Here, the sensors of the exemplary embodiment are attached to a common structure of interest, such as the neutral conductor 605 (here, a copper bus bar) that operates to ensure that the power transformer is properly grounded. Other sensors may also be attached to the structure of interest. Here, a current sensor is used in combination with a fiber optic temperature sensor, which is used for temperature compensation. A third sensor can be used to monitor alternating current on the neutral, the presence of which would be indicative of other potential problems in the electrical network, such as a phase imbalance on the lines connected to the transformer. Other combinations of fiber optic sensors may be used depending on the nature of the application, such as electromagnetic phenomena (such as voltage, current, electric field, magnetic field,), static or dynamic pressure, strain, and displacement, or acceleration.

The fiber optic sensors can share a common current source. For example, here, a common current source can power six LEDs at 100 mA current, and each LED can provide light to power a single fiber optic sensor. The modulated light that is received by the receiving fibers of the sensors is sent to the light sensing element where it is detected. The light sensing element translate the received light into an electric signal output, which can be utilized directly as an analog output and sent to a signal unit or the signal may be converted to digital form locally and sent to a processing unit.

The analog or digital outputs can be processed locally or can be sent via a communications unit to another device for signal processing. A processing unit may be used with the system to analyze the waveforms of the measured currents (e.g. –whether there are increasing or decreasing levels of current within the system). The analysis of the sensor outputs may also indicate the presence of other signals upon the measured area of interest, such as temperature or AC, which may be indicative of other problems in the electric power system. Further, using multiple sensors it is possible to compare the signals from each of the sensors to understand the characteristics of the low frequency current, such as its directionality.

In an envisioned alternative embodiment, the six receiving fibers of each fiber optic sensor are arranged in order to transmit light into a larger diameter fiber for transmission to the light sensing element. A connection is arranged at the end of the six smaller diameter fibers to couple light into a larger diameter optical fiber. In this example, the larger diameter fiber has a core diameter of 600 microns, and the smaller diameter fibers have core diameters of 200 microns, all with numerical apertures of 0.37. The larger diameter fiber embodiment can be used to accommodate remote monitoring applications where a signal return channel is desirable. Alternative embodiments, such as those discussed in later paragraphs, allow for further multiplexing of the sensor system whereby a single light source can provide light to power multiple fiber optic sensors, allowing for a system comprising a multitude of sensors.

The use of additional sensors can be useful to compensate for potential sources of noise in the measured signals. For example, two sensors can be located near each other so they are exposed to approximately the same temperature, with one of them being exposed to a reference signal, and the other exposed to the fundamental signal to be sensed. The detected results can be compared to eliminate or minimize noise effects, such as those that may arise due to temperature changes. Alternatively, the multiplexed sensor systems can be used to measure a combination of multiple physical phenomena in addition to, in the alternative to, or in combination with the geomagnetically induced current sensors, including measurements of strain, pressure, acceleration, temperature, displacement, electromagnetic phenomena (voltage, current, magnetic fields, electric fields), or other physical phenomena.

Figure 7:
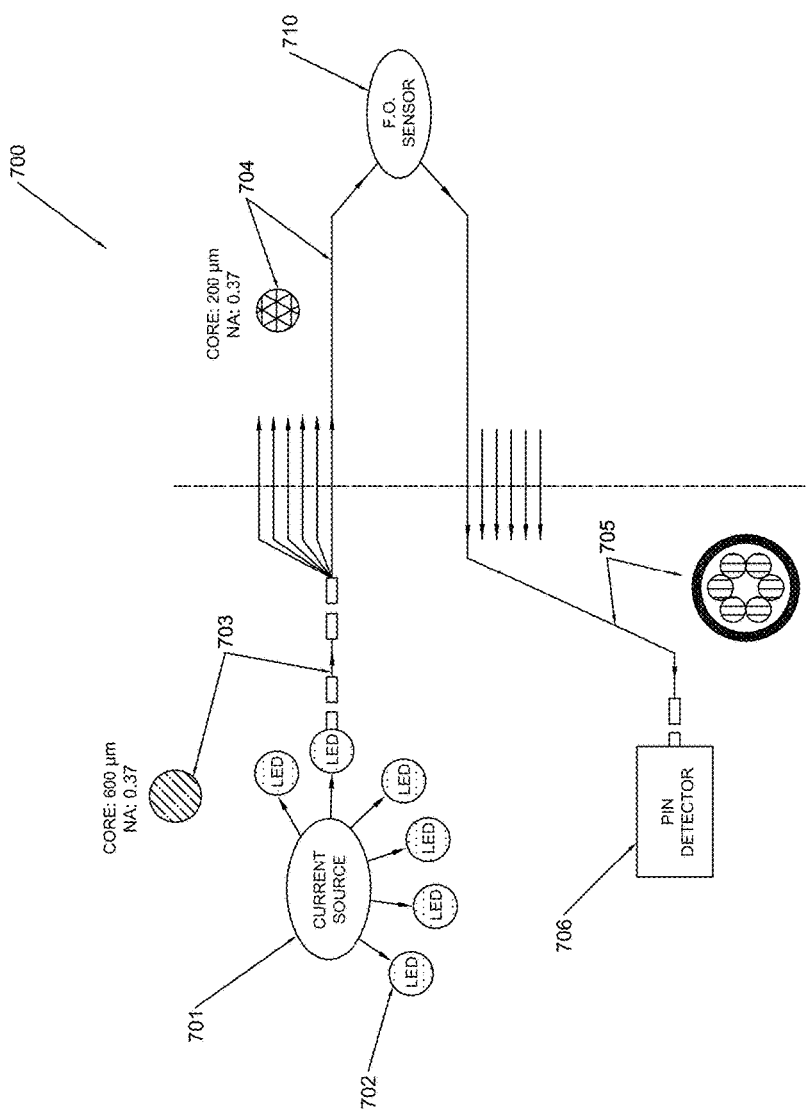
FIG. 7 illustrates an alternative embodiment of a fiber optic sensor system according to the present invention.

FIG. 7 illustrates an exemplary fiber optic sensor system 700 in which a current source 701 powers a plurality of light sources, and each light source transmits light into a large diameter multimode fiber, in order to power multiple sensors. The sensor system allows a current source to power a plurality of LEDs, and each LED transmits light into a large diameter multimode fiber. This embodiment allows a single current source supplying power to six light sources, here LEDs 702, and each LED supplying light to six sensors. In this embodiment six 200 micron core diameter fibers can be efficiently supplied with light, allowing each current source to power six LEDs, which in turn, supply light to six transmitting fibers, and allowing each LED source to power six sensors, for a total of 36 sensors powered by a single current source.

For each LED, a larger diameter fiber 703 is arranged to receive light from the LED via a connector pair. A connector splits the light from the large diameter multimode fiber into six smaller diameter multimode fibers 704. A connection is arranged at the end of the larger diameter optical fiber 703 to couple light into six smaller diameter fibers 704. In this example, the larger diameter fiber has a core diameter of 600 microns, and the smaller diameter fibers have core diameters of 200 microns, all with numerical apertures of 0.37.

Each smaller diameter fiber 704 transmits the light to an individual sensor 710, in this example, a fiber optic current sensor, such as those described in FIGS. 1 to 3. One or more fiber optic sensors is attached to a structure or structures in which a given physical phenomena or combination of physical phenomena is to be measured. Reflected light is transmitted from each of the sensors through six receiving fibers 705, which extend from each sensor, and transmit light via the receiving fibers to a photodetector 706. Since the output electrical signal from the photodetector is proportional to the physical phenomena in the structure to which the sensor is attached, the desired physical effect to be measured can be determined.

In this example, each LED supplies light to six sensors via the six smaller diameter fibers receiving light from the larger diameter fiber. The sensors 710 can be the seven fiber sensors illustrated in FIGS. 1 to 3, or any other desired optical fiber based sensor. The sensors may be fiber optic current sensors, but may also include other fiber optic electromagnetic phenomena sensors, pressure sensors, acceleration sensors, strain sensors, temperature sensors, displacement sensors, or other fiber-optic sensors designed to measure physical phenomena.

As with FIG. 6, the multiplexed sensor systems of FIG. 7 can be used to measure geomagnetically induced currents, but may also be used to measure strain, pressure, acceleration, temperature, displacement, electromagnetic phenomena, or other physical phenomena at various points within a common structure or material, or may be used to sense various phenomena at multiple locations or multiple structures, such as on each of the phases of a three-phase electric power system or various pieces of equipment within an electric power substation. A combination of sensor types can also be used to compensate for sources of noise.

Although this invention has been described in relation to the exemplary embodiments, it is well understood by those skilled in the art that other variations and modifications can be affected on the preferred embodiments without departing from the scope and spirit of the invention as set forth herein and within the claims.

The invention claimed is:

1. A sensor system for measuring electric current and other physical phenomena in an electric circuit comprising:
   at least two fiber optic sensors, at least one of which is a fiber optic current sensor;
      each fiber optic sensor including at least one optical fiber arranged to transmit light from a light source and at least one receiving optical fiber arranged to receive light;
   the fiber optic current sensor being capable of measuring electric currents operating at a frequency of less than 1 Hz; and
   at least one light sensing element for each of the sensors arranged to receive light from the at least one receiving optical fiber of the sensor;
   wherein each fiber optic sensor is arranged to receive light from a light source, and to modulate the intensity of the received light in proportion to a displacement of a reflective material caused by a physical phenomena detected by the sensor, and wherein the least one light sensing element for each sensor is configured to detect the modulated light; and
   wherein each fiber optic sensor is configured to measure the physical phenomena based on the detected intensity modulation of the light.

2. The system according to claim 1, wherein the electric current to be detected by the fiber optic current sensor is produced by a geomagnetic disturbance (GMD) or an electromagnetic pulse (EMP).

3. The system according to claim 1, wherein at least one fiber optic sensor comprises a static or dynamic pressure sensor, strain sensor, electromagnetic phenomena sensor, displacement sensor, acceleration sensor, or temperature sensor.

4. The system according to claim 1, wherein the fiber optic current sensor is capable of measuring electric current operating at a frequency of greater than 1 Hz.

5. The system according to claim 1, further comprising: at least one light source.

6. The system according to claim 5, wherein the at least one light source is powered by a common current source.

7. The system according to claim 5, wherein the light source is a light emitting diode or a laser.

8. The system according to claim 1, wherein the light sensing element is at least one of a PIN detector, a photodetector, a photodiode, a photomultiplier tube, or a semiconductor-metal detector.

9. The system according to claim 1, wherein the light sensing element converts the light received from the sensor into an electrical signal.

10. The system according to claim 9, wherein the system further comprises a converter to convert the electrical signal into a digital output.

11. The system according to claim 1, wherein the outputs from the light sensing elements are indicative of multiple instances of a physical phenomenon, including at least one of pressure, temperature, strain, acceleration, electromagnetic phenomena, displacement, or acceleration, or a combination of these physical phenomena.

12. The system according to claim 1, wherein the at least one receiving optical fiber comprises a plurality of receiving optical fibers.

13. The system according to claim 12, wherein the plurality of receiving optical fibers comprises six receiving optical fibers.

14. The system according to claim 13, wherein the sensor's six receiving optical fibers are arranged to transmit light into a second single receiving optical fiber having a larger diameter than the six receiving optical fibers, and the second larger diameter receiving optical fiber transmits the light from sensor's six receiving optical fibers to the light sensing element.

15. The system according to claim 1, wherein the sensors take measurements of a common structure.

16. The system according to claim 15, wherein the common structure is an electrical circuit.

17. The system according to claim 15, wherein the common structure is the grounded neutral connection of a power transformer.

18. The system according to claim 15, wherein the common structure is a power transformer.

19. The system according to claim 1, wherein the sensors take measurements of different structures.

20. The system according to claim 1, wherein at least one of the sensors is a fiber optic current sensor and at least one of the sensors is a fiber optic temperature sensor.

21. The system according to claim 1, further comprising at least one optical fiber arranged between each sensor and each light sensing element.

22. The system according to claim 1, wherein the fiber optic current sensor measures current by measuring the displacement in a material that is caused by the magnetostrictive effect.

23. The system according to claim 1, wherein the fiber optic sensor measures current by measuring the displacement in a material that is caused by the Lorentz force.

24. A method for detecting electric currents associated with geomagnetic disturbances, electromagnetic pulses, and other electrical power system disturbances with one or more fiber optic sensors, the method comprising:
    positioning at least one intensity modulated fiber optic sensor adjacent to a reflective surface on a piece of equipment in the electrical network, the reflective surface experiencing displacement due to a physical condition experienced by the piece of equipment;
    transmitting light from a light source through a transmitting fiber to the reflective surface, wherein the reflective surface is spaced apart from the end of transmitting fiber;
    receiving intensity modulated light from the reflective surface in at least one receiving fiber in the at least one intensity modulated fiber optic sensor, the intensity of the received light modulated in proportion to the amount of displacement;
    transmitting the intensity modulated light to a light sensing element and sensing the intensity modulated light with the sensing element; and
    determining, based on the sensed intensity modulation of the light, the physical condition being experienced by the piece of equipment.

25. The method according to claim 24, wherein at least one of the fiber optic sensors is a current sensor.

26. The method according to claim 24, wherein at least one of the fiber optic sensors is a pressure sensor, strain sensor, electromagnetic phenomena sensor, acceleration sensor, displacement sensor, or temperature sensor.

27. A system of intensity modulated fiber optic sensors for detecting low frequency and direct currents in electric power systems, comprising:
    at least two intensity modulated fiber optic sensors, including at least one intensity modulated fiber optic current sensor;
    at least one light source;
    at least one light sensing element for each sensor;
    at least one optical fiber arranged to transmit light from the light source to each fiber optic sensor;
    at least one optical fiber arranged to transmit intensity modulated light, proportional to a displacement of a reflective material caused by a physical phenomena, from each fiber optic sensor to its light sensing element configured to detect the intensity modulated light; and
    a processor configured to receive the electrical signal outputs from the light sensing element and to convert the signals into an output representative of the physical phenomena, and further configured to measure the physical phenomena based on the detected intensity modulation of the light, with the system taking at least one measurement of direct current or current with at a frequency of lower than 1 Hz.

28. The system according to claim 27, further comprising a converter to convert the electrical signal output of the light sensing element to a digital format.

29. The system according to claim 27 further comprising at least one additional fiber optic current sensor spaced apart from the first fiber optic current sensor to detect the presence of low frequency electric currents produced by geomagnetic disturbances or electromagnetic pulses on multiple structures or at multiple locations.

30. The system according to claim 27, wherein the processor compares the output difference between the current signals generated by at least two fiber optic current sensors at one or more locations or pieces of equipment to determine characteristics of a geomagnetic disturbance or electromagnetic pulse.

31. The system according to claim 27, wherein at least one fiber optic current sensor measures the electric current present upon the grounded neutral of a power transformer.

32. The system according to claim 27, wherein the system measures alternating current.

33. The system according to claim 27, comprises at least one intensity modulated fiber optic sensors capable of measuring pressure, strain, electromagnetic phenomena, acceleration, displacement, or temperature.

34. The system according to claim 27, wherein the fiber optic sensors measure physical phenomena on equipment used in the generation, transmission, and distribution of electrical power.

35. The system according to claim 34, wherein the equipment is located within an electrical substation.

36. The system according to claim 27, wherein the fiber optic sensors are located at least ten feet from the light sensing element.

37. The system according to claim 27, wherein the output of the measured phenomena is communicated to electric power system operators.

* * * * *